(12) United States Patent
Nakada et al.

(10) Patent No.: US 8,368,475 B2
(45) Date of Patent: Feb. 5, 2013

(54) OSCILLATOR CIRCUIT

(75) Inventors: Kenji Nakada, Kyoto (JP); Nobuaki Umeki, Kyoto (JP)

(73) Assignee: Rohm Co., Ltd. (JP)

( * ) Notice: Subject to any disclaimer, the term of this patent is extended or adjusted under 35 U.S.C. 154(b) by 330 days.

(21) Appl. No.: 12/731,235

(22) Filed: Mar. 25, 2010

(65) Prior Publication Data

US 2010/0253301 A1    Oct. 7, 2010

(30) Foreign Application Priority Data

Mar. 25, 2009  (JP) ................. 2009-074976
Mar. 8, 2010   (JP) ................. 2010-050632

(51) Int. Cl.
*H03K 3/26* (2006.01)

(52) U.S. Cl. ........ 331/111; 331/143; 327/172; 323/237; 323/242

(58) Field of Classification Search .................. 331/111, 331/143; 327/172; 323/237, 242
See application file for complete search history.

(56) References Cited

U.S. PATENT DOCUMENTS 7,772,904 B1 *  8/2010  Cooke .................. 327/175

FOREIGN PATENT DOCUMENTS

| JP | 1-243707 A | 9/1989 |
|----|------------|--------|
| JP | 2005-229744 A | 8/2005 |

* cited by examiner

*Primary Examiner* — Arnold Kinkead
(74) *Attorney, Agent, or Firm* — Cantor Colburn LLP (57) ABSTRACT

A first capacitor is arranged such that the electric potential at a first terminal is fixed. A first discharging circuit discharges the first capacitor at a timing that corresponds to a cyclic synchronization signal received from an external circuit. A first comparator compares the voltage at a second terminal of the first capacitor with a predetermined threshold voltage, and generate a judgment signal that corresponds to the comparison result. A charging circuit generates a charging current the current value of which is adjusted according to the level of the judgment signal at a timing that corresponds to the synchronization signal, and supplies the charging current thus generated to the first capacitor.

14 Claims, 8 Drawing Sheets

OSCILLATOR CIRCUIT

BACKGROUND OF THE INVENTION

1. Field of the Invention

The present invention relates to a technique for generating a cyclic signal having a sloping waveform.

2. Description of the Related Art

Switching power supply devices such as a switching regulator or the like employ a pulse signal in order to switch a switching element ON and OFF. As a method for generating such a pulse signal, a technique is employed in which the charging operation and the discharging operation of a capacitor are repeatedly alternated so as to generate a cyclic signal (triangle wave signal) having a sloping waveform, and the cyclic signal thus generated is sliced at a predetermined level so as to generate a pulse signal based upon the points of intersection of the cyclic signal and the predetermined level (Patent documents 1 and 2).

As an oscillator circuit configured to generate a triangle wave signal, a self-running method (self-excitation method) and an external synchronization method (separate excitation method) are known. With the former method, the voltage at a capacitor is compared with a predetermined threshold voltage, and the timing at which the capacitor is charged and discharged is controlled with the timing obtained based upon the comparison result. On the other hand, with the latter method, the timing at which the capacitor is charged and discharged is controlled with the timing of an external clock signal used as a reference signal. This method is effectively employed in a case in which it is desired that an oscillator circuit operate synchronously with an external circuit.

RELATED ART DOCUMENTS

Patent Documents

[Patent Document 1]
Japanese Patent Application Laid Open No. H01-243707
[Patent Document 2]
Japanese Patent Application Laid Open No. 2005-229744

In a case in which a cyclic signal is generated using the external synchronization method, the peak voltage of the sloping waveform changes according to the cycle of the reference clock signal. With an arrangement in which a pulse signal is generated by slicing the cyclic signal at a predetermined level, in a case in which the peak voltage of the cyclic signal (sloping waveform) changes, the duty ratio of the pulse signal fluctuates, leading to adverse effects on the circuit operation, which is a problem.

SUMMARY OF THE INVENTION

The present invention has been made in order to solve such a problem. Accordingly, it is an exemplary purpose of the present invention to provide a technique for suppressing fluctuation of the peak voltage when a cyclic signal having a sloping waveform is generated using an external synchronization method.

An embodiment of the present invention relates to an oscillator circuit configured to generate a cyclic signal having a sloping waveform. The oscillator circuit comprises: a first capacitor arranged such that the electric potential at a first terminal thereof is fixed; a first discharging circuit configured to discharge the first capacitor at a timing that corresponds to a cyclic synchronization signal received from an external circuit; a comparator configured to compare the voltage at another, second terminal of the first capacitor having the aforementioned first terminal with a predetermined threshold voltage, and to generate a judgment signal that corresponds to the comparison result; and a charging circuit configured to generate a charging current the current value of which is adjusted according to the level of the judgment signal at a timing that corresponds to the synchronization signal, and to supply the charging current thus generated to the first capacitor. With such an arrangement, the voltage at the second terminal of the first capacitor is output as a cyclic signal.

The level of the judgment signal indicates whether the voltage of the cyclic signal, i.e., the peak voltage of the sloping waveform at a timing immediately before the discharging operation is higher or lower than a predetermined threshold voltage. Thus, by adjusting the charging current according to the level of the judgment signal, such an arrangement is capable of suppressing fluctuation of the peak voltage of the sloping waveform.

Also, the charging circuit may comprise: a control voltage generating unit configured to generate a control voltage according to the judgment signal; and a voltage/current conversion circuit configured to convert the control voltage into a current, thereby generating the charging current that corresponds to the control voltage. With such an arrangement, when the judgment signal is at a first level, the control voltage generating unit adjusts the control voltage such that it approaches a predetermined first voltage value, and when the judgment signal is at a second level, the control voltage generating unit adjusts the control voltage such that it approaches a predetermined second voltage value.

With such an embodiment, the charging current can be changed in a range between a value that corresponds to the first voltage value and a value that corresponds to the second voltage value. With such an arrangement, when the level of the judgment signal indicates that the peak voltage is higher than the threshold voltage, the control voltage is changed so as to reduce the charging current, and when the level of the judgment signal indicates that the peak voltage is lower than the threshold voltage, the control voltage is changed so as to increase the charging current. Thus, such an arrangement is capable of controlling the peak voltage of the sloping waveform such that it approaches the threshold voltage.

Also, the control voltage generating unit may comprise: a reference voltage source configured to generate a reference voltage adjusted such that, when the judgment signal is at the first level, the reference voltage is set to the first voltage value, and when the judgment signal is at the second level, the reference voltage is set to the second voltage value; a second capacitor arranged such that the electric potential at a first terminal thereof is fixed; and a buffer configured such that the source current and the sink current thereof are each maintained at predetermined values or less, and configured to receive the reference voltage, and to supply the reference voltage thus received to another, second terminal of the aforementioned second capacitor having the aforementioned first terminal. Also, the electric potential at the second terminal of the second capacitor may be output as the control voltage.

With such an embodiment, the charging current can be gradually changed in a range between a value that corresponds to the first voltage value and a value that corresponds to the second voltage value. This improves the stability of the peak voltage.

Also, the control voltage generating unit may further comprise an auxiliary charging circuit configured such that, when the electric potential at the second terminal of the second capacitor is lower than a predetermined threshold voltage, the auxiliary charging circuit supplies an auxiliary current to the second capacitor.

Such an embodiment provides a quick start-up operation for the circuit.

Also, the oscillator circuit according to an embodiment may further comprise a second discharging circuit configured such that, upon detecting, based upon the judgment signal, that the voltage at the second terminal of the first capacitor has reached the threshold voltage, the second discharging circuit discharges the first capacitor. Such an arrangement provides a self-running mode in which a cyclic signal is generated using self-running oscillation without involving a synchronization signal.

Another embodiment of the present invention relates to a switching regulator including a switching element. The switching regulator comprises: an error amplifier configured to amplify the difference between a feedback voltage that corresponds to an output voltage of the switching regulator and a predetermined set voltage; an oscillator circuit according to any one of the aforementioned embodiments, configured to generate a cyclic signal; a pulse width modulation comparator configured to compare the cyclic signal with the output voltage of the error amplifier so as to generate a pulse width modulation signal; and a driver configured to control an ON/OFF operation of the switching element according to the pulse width modulation signal.

With such an embodiment, the switching regulator can be operated synchronously with the cyclic signal.

Yet another embodiment of the present invention relates to a method for generating a cyclic signal. The method comprises: discharging a first capacitor arranged such that the electric potential at a first terminal thereof is fixed, at a timing that corresponds to a cyclic synchronization signal received from an external circuit; and charging the first capacitor by generating a charging current the current value of which is adjusted according to a comparison result obtained by comparing the voltage at another, second terminal of the aforementioned first capacitor having the aforementioned first terminal, at a timing that corresponds to the synchronization signal. With such an arrangement, the discharging operation and the charging operation are repeatedly performed, and the voltage at the second terminal of the first capacitor is output as a cyclic signal.

Yet another embodiment of the present invention relates to a switching regulator including a switching element. The switching regulator comprises: a set voltage generating unit configured to generate a set voltage; an error amplifier configured to amplify the difference between a feedback voltage that corresponds to an output voltage of the switching regulator and a predetermined set voltage; an oscillator circuit configured to generate a cyclic signal; a pulse width modulation comparator configured to compare the cyclic signal with the output voltage of the error amplifier so as to generate a pulse width modulation signal; and a driver configured to control an ON/OFF operation of the switching element according to the pulse width modulation signal. Furthermore, the set voltage generating unit comprises: a reference voltage source configured to generate a reference voltage which can be switched between at least two values; a second capacitor arranged such that the electric potential at a first terminal thereof is fixed; and a buffer configured such that the source current and the sink current thereof are each maintained at predetermined values or less, and configured to receive the reference voltage, and to supply the reference voltage thus received to anther, second terminal of the aforementioned second capacitor having the aforementioned first terminal.

With such an arrangement, the electric potential at the second terminal of the second capacitor is output as the set voltage.

With such an embodiment, the set voltage can be gradually changed. Thus, the output voltage of the switching regulator can be gradually switched (in a soft-start manner) without the need to generate an additional soft-start voltage. That is to say, such an arrangement does not require a capacitor used to generate such a soft-start voltage.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

An oscillator circuit 100 according to a first embodiment is configured to enable the mode to be switched between an external synchronization mode and a self-running mode. In the external synchronization mode, the oscillator circuit 100 generates a cyclic signal OSC having a sloping waveform, synchronously with a synchronization signal SYNC received from an external circuit. In the self-running mode, the oscillator circuit 100 oscillates independent of the synchronization signal SYS, thereby generating a cyclic signal OSC.

Figure 1:
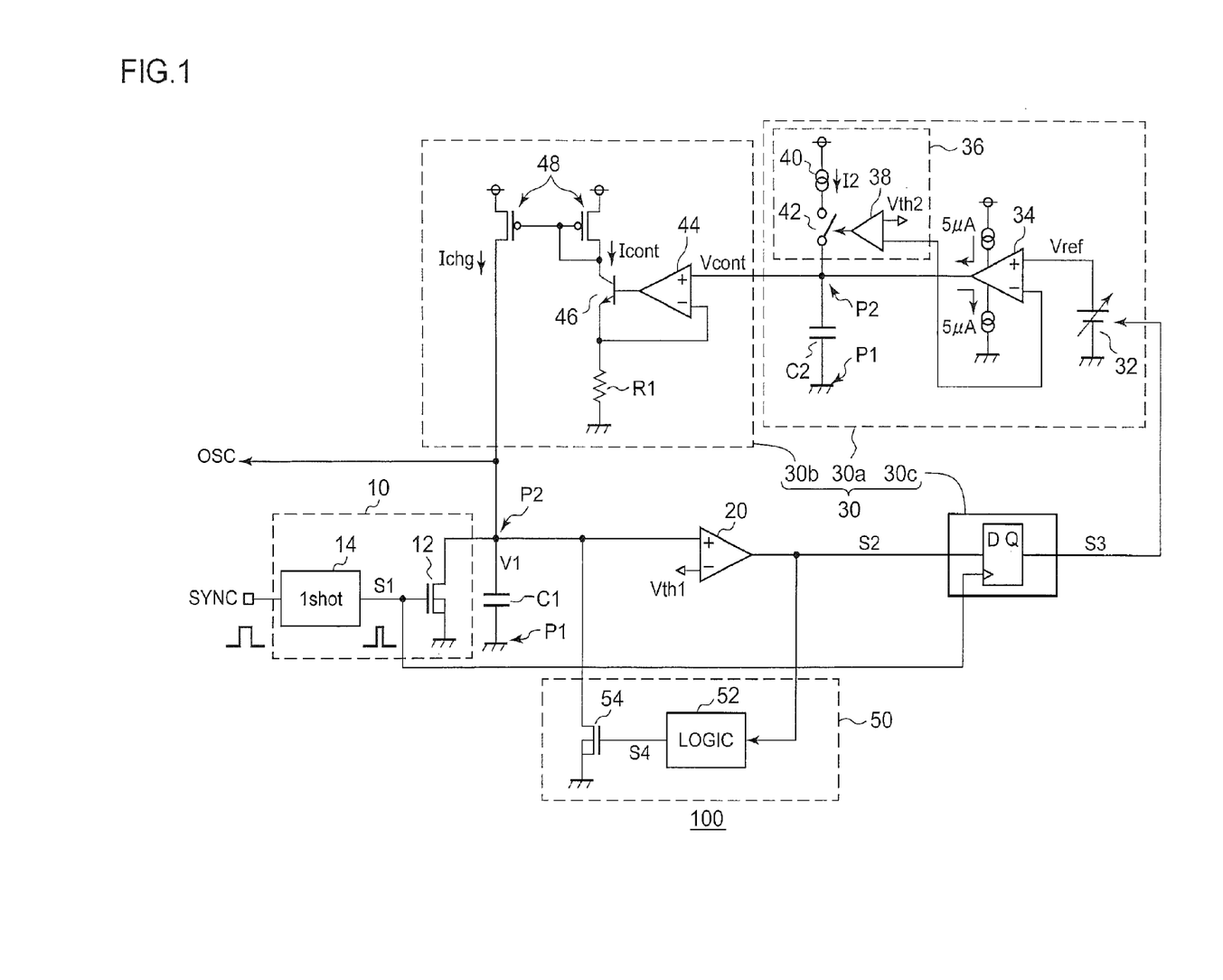
FIG. 1 is a circuit diagram which shows a configuration of an oscillator circuit according to a first embodiment.

FIG. 1 is a circuit diagram which shows a configuration of the oscillator circuit 100 according to the first embodiment. The oscillator circuit 100 includes a first discharging circuit 10, a first capacitor C1, a first comparator 20, a charging circuit 30, and a second discharging circuit 50.

The first capacitor C1 is arranged such that a first terminal P1 is grounded, i.e., the electric potential at the first terminal P1 is fixed. The first discharging circuit 10 discharges the first capacitor C1 at a timing that corresponds to the cyclic synchronization signal SYNC received from an external circuit.

The first discharging circuit 10 preferably includes a first discharging transistor 12 and a one-shot circuit 14. The first discharging transistor 12 is a switch element connected in parallel with the first capacitor C1, and is configured as a MOSFET or a bipolar transistor. The first discharging transistor 12 is arranged such that one terminal (source or emitter) is grounded, and such that the other terminal (drain or collector) is connected to a second terminal P2 of the first capacitor.

The one-shot circuit 14 generates a discharging instruction signal S1 which is high level during a first period τ1 after a timing at which a predetermined edge is detected in the synchronization signal SYNC. Description will be made regarding an arrangement in which the positive edge is used as the aforementioned predetermined edge. However, the present invention is not restricted to such an arrangement. Also, the negative edge may be used as the aforementioned predetermined edge. Also, both the positive edge and the negative edge may be used as the aforementioned predetermined edge. The discharging instruction signal S1 is input to a control terminal (gate or base) of the first discharging transistor 12. That is to say, the first discharging transistor 12 is ON during the first period τ1 after a positive edge is detected in the synchronization signal SYNC, thereby discharging the first capacitor C1.

The first comparator 20 compares the voltage (capacitor voltage V1) at the second terminal P2 of the first capacitor C1 with a predetermined threshold voltage Vth1, and generates a judgment signal S2 that corresponds to the comparison result. When V1>Vth1, the judgment signal S2 is set to the high level (first level), and when V1<V2, the judgment signal S2 is set to the low level (second level).

The charging circuit 30 supplies a charging current Ichg to the first capacitor C1, thereby charging the first capacitor C1. The charging circuit 30 receives the judgment signal S2 and the discharging instruction signal S1 as the input signals. The charging circuit 30 adjusts the current value of the charging current Ichg according to the level of the judgment signal S2 at a timing at which a positive edge occurs in the discharging instruction signal S1. The timing at which the positive edge occurs in the discharging instruction signal S1 matches the timing at which the positive edge occurs in the synchronization signal SYNC. That is to say, the charging circuit 30 adjusts the charging current Ichg according to the level of the judgment signal S2 at a timing that corresponds to the synchronization signal SYNC (which will be referred to as "judgment timing" hereafter).

When the judgment signal S2 is at the first level (high level), i.e., V1>Vth1, at the judgment timing, the charging circuit 30 reduces the charging current Ichg. Conversely, when the judgment signal S2 is at the second level (low level), i.e., V1<Vth1, at a judgment timing, the charging circuit 30 increases the charging current Ichg.

During the first period τ1, in which the first discharging circuit 10 discharges the first capacitor C1, the capacitor voltage V1 is set to the ground voltage (discharging period). Subsequently, after the discharging operation of the first discharging circuit 10 stops, the first capacitor C1 is charged with the charging current Ichg, and thus the capacitor voltage V1 rises with time (charging period). That is to say, a sloping waveform is generated.

The oscillator circuit 100 generates a cyclic signal OSC (triangle wave signal) having a sloping waveform by repeatedly alternating the charging period and the discharging period, synchronously with the synchronization signal SYNC.

The judgment timing is nothing but the timing at which the first discharging circuit 10 starts to discharge the first capacitor C1. That is to say, the capacitor voltage V1 at the first capacitor C1 at the judgment timing is approximately the same as the peak voltage of the sloping waveform. When the peak voltage Vpeak of the sloping waveform is higher than the threshold voltage Vth1, the oscillator circuit 100 reduces the charging current Ichg. This functions as feedback which reduces the peak voltage Vpeak in the next cycle. Conversely, when the peak voltage Vpeak is lower than the threshold voltage Vth1, the oscillator circuit 100 increases the charging current Ichg. This functions as feedback which increases the peak voltage Vpeak in the next cycle.

As described above, the oscillator circuit 100 performs a feedback operation such that the peak voltage Vpeak approaches the threshold voltage Vth1, thereby suppressing fluctuation of the peak voltage Vpeak.

The charging circuit 30 preferably includes a control voltage generating unit 30a, a voltage/current conversion circuit 30b, and a logic unit 30c.

The logic unit 30c includes a D flip-flop, for example. The D flip-flop is arranged such that the discharging instruction signal S1 (synchronization signal SYNC) is input to the clock terminal thereof, and such that the judgment signal S2 is input to the data terminal D thereof. The D flip-flop outputs an output signal Q (S3) such that it latches the judgment signal S2 according to a positive edge of the synchronization signal SYNC (i.e., at a judgment timing), and such that it retains the value thus latched until the next positive edge is detected in the synchronization signal SYNC.

The control voltage generating unit 30a generates a control voltage Vcont according to the judgment signal S2 at a judgment timing. When the judgment signal S2 is at the first level (high level), the control voltage generating unit 30a adjusts the control voltage Vcont such that it approaches a predetermined first voltage value Vcont1. When the judgment signal S2 is at the second level (low level), the control voltage generating unit 30a adjusts the control voltage Vcont such that it approaches a predetermined second voltage value Vcont2 (note that Vcont1<Vcont2).

The voltage/current conversion circuit 30b converts the control voltage Vcont into a control current Icont, and generates a charging current Ichg according to the current Icont. The charging current Ichg may be equal to the control current Icont. Also, the charging current Ichg may have a predetermined relation to the control current Icont (may be set to a current obtained by multiplying the control current Icont by a predetermined integer, for example).

Such an arrangement is capable of changing the charging current Ichg in a range between a value (Ichg1) that corresponds to the first voltage value Vcont1 and a value (Ichg2) that corresponds to the second voltage value Vcont2. Thus, when the level of the judgment signal S2 indicates that the peak voltage Vpeak is higher than the threshold voltage Vth1, the control voltage Vcont is changed such that the charging current Ichg is reduced. When the level of the judgment signal S2 indicates that the peak voltage Vpeak is lower than the threshold voltage Vth1, the control voltage Vcont is changed such that the charging current Ichg is increased. As a result, the peak voltage Vpeak of the sloping waveform can be made to approach the threshold voltage Vth1.

Description will be made regarding a further specific example configuration of the charging circuit 30. For example, the control voltage generating unit 30a includes a reference voltage source 32, a buffer 34, a second capacitor C2, and an auxiliary charging circuit 36.

When the judgment signal S3 is at the first level (high level), the reference voltage source 32 supplies a voltage represented by a first voltage value Vcont, and when the judgment signal S3 is at the second level (low level), the reference voltage source 32 supplies a voltage represented by a second voltage value Vcont2.

The second capacitor C2 is arranged such that a first terminal P1 thereof is grounded, and accordingly, the electric potential at the first terminal P1 is fixed. The buffer (voltage follower) 34 is configured such that the source current and the sink current thereof are each smaller than a predetermined value. For example, the upper limits of the source current and the sink current are each set to 5 µA. The source current and the sink current can be each designed and controlled by adjusting the size of a push-pull transistor provided as an output stage of an amplifier which is a component of the buffer 34, and the bias voltage to be applied to the push-pull transistor. The buffer 34 receives a reference voltage Vref from the reference voltage source 32, and applies the reference voltage thus received to a second terminal P2 of the second capacitor C2.

The control voltage generating unit 30a outputs the electric potential at the second terminal P2 of the second capacitor C2 as the control voltage Vcont.

In a steady state, the reference voltage Vref have the same voltage value as that of the control voltage Vcont. When the reference voltage Vref1 changes, the control voltage Vcont changes according to the change in the reference voltage Vref. The response speed is defined by the source current and the sink current of the buffer 34 and the capacitance of the second capacitor C2. Such an arrangement is capable of gradually changing the control voltage Vcont when the reference voltage Vref is switched from the first voltage value Vcont1 to the second voltage value Vcont2, or is switched from the second voltage value Vcont2 to the first voltage value Vcont1.

When the electric potential Vcont at the second terminal P2 of the second capacitor C2 is lower than a predetermined threshold voltage Vth2, the auxiliary charging circuit 36 supplies an auxiliary current I2 to the second capacitor C2. For example, the auxiliary charging circuit 36 includes a second comparator 38, a current source 40, and a switch 42. The current source 40 generates the auxiliary current I2. The second comparator 38 compares the control voltage Vcont with the second threshold voltage Vth2. The switch 42 is arranged on a path of the auxiliary current I2, and its ON/OFF operation is controlled according to an output signal of the second comparator 38.

Next, description will be made regarding an example configuration of the voltage/current conversion circuit 30b. The voltage/current conversion circuit 30b includes an operational amplifier 44, a transistor 46, a current mirror circuit 48, and a frequency setting resistor R1.

A first terminal of the frequency setting resistor R1 is grounded. The transistor 46 is configured as an NPN bipolar transistor (or N-channel MOSFET). One terminal (emitter or source) of the transistor 46 is connected to a second terminal of the frequency setting resistor R1. The control voltage Vcont is input to the non-inverting input terminal of the operational amplifier 44, and the non-inverting input terminal thereof is connected to the second terminal of the frequency setting resistor R1. The output terminal of the operational amplifier 44 is connected to the control terminal (base or gate) of the transistor 46. The control voltage Vcont is applied to the second terminal of the frequency setting resistor R1. The control current, which is represented by Expression Icont=Vcont/R, flows through a path including the transistor 46 and the frequency setting resistor R1.

The current mirror circuit 48 copies the control current Icont with a predetermined mirror ratio, and returns the current thus mirrored, thereby generating a charging current Ichg.

The slope of the oscillator signal OSC generated by the oscillator circuit 100 is determined by the resistance value of the frequency setting resistor R1 and the capacitance value of the first capacitor C1. Accordingly, the frequency setting resistor R1 and the first capacitor C1 are preferably provided in the form of external components.

The above is the configuration which relates to the external synchronization mode. Next, description will be made regarding a configuration which relates to the self-running mode. In order to provide the self-running mode, a second discharging circuit 50 is provided.

The second discharging circuit 50 receives the judgment signal S2 generated by the first comparator 20. When the judgment signal S2 is switched from the low level (the second level) to the high level (the first level) (positive edge switching), i.e., when the capacitor voltage V1 at the first capacitor C1 reaches the threshold voltage Vth1, the second discharging circuit 50 discharges the first capacitor C1.

For example, the second discharging circuit 50 includes a logic circuit 52 and a second discharging transistor 54. The second discharging transistor 54 is arranged in parallel with the first capacitor C1, in the same way as the first discharging transistor 12. The logic circuit 52 includes a one-shot circuit, for example. When a positive edge occurs in the judgment signal S2, the logic circuit 52 sets a discharging instruction signal S4 to the high level so as to turn ON the second discharging transistor during a second period τ2. The first period τ1 may be equal to the second period τ2.

Figure 2A:
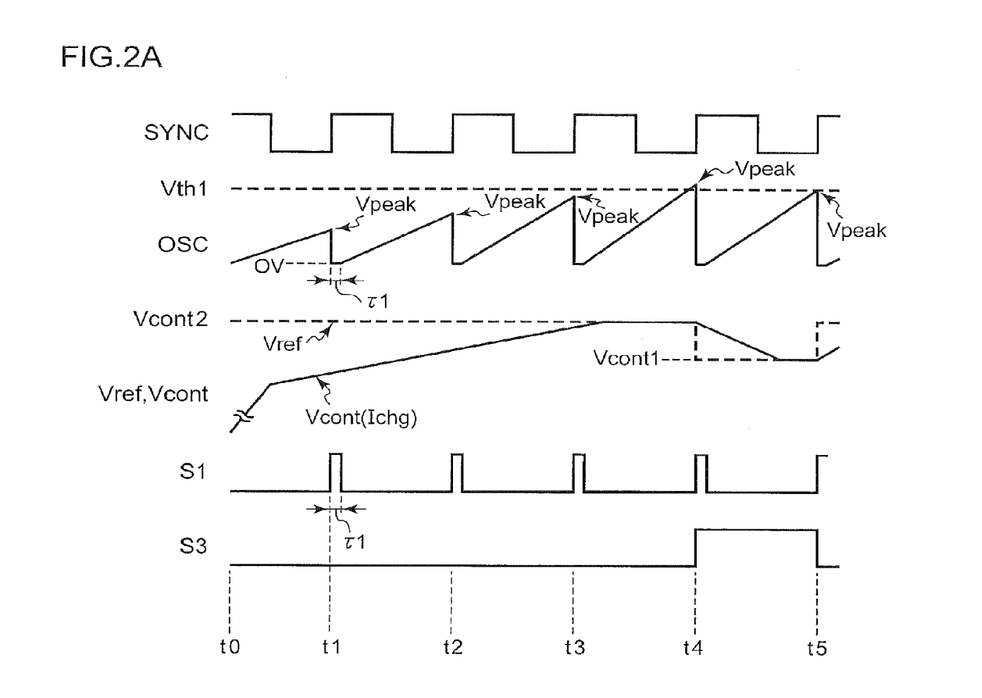
FIGS. 2A and 2B are time charts which show the operation of the oscillator circuit shown in FIG. 1.
Figure 2B:
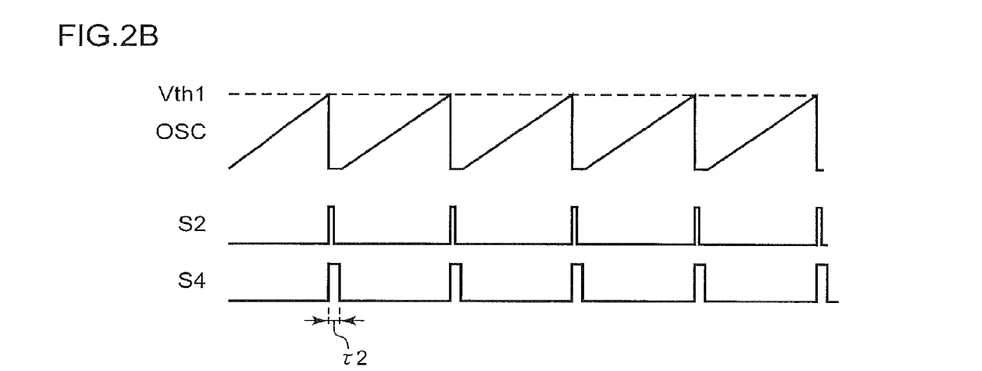

The above is the configuration of the oscillator circuit 100. Next, description will be made regarding the operation thereof. FIGS. 2A and 2B are time charts which show the operation of the oscillator circuit 100 shown in FIG. 1. FIG. 2A shows the operation when the external synchronization mode is selected. FIG. 2B shows the operation when the self-running mode is selected.

First, description will be made regarding the operation of the external synchronization mode. The time point t0 is in the charging period. In this stage, the first capacitor C1 is charged, thereby generating the oscillator signal OSC having a sloping waveform. When a positive edge occurs in the synchronization signal SYNC at the time point t1, the discharging instruction signal S1 is set to the high level during the first period τ1, thereby providing a discharging period. The first capacitor C1 is discharged during the discharging period, and accordingly, the electric potential of the cyclic signal OSC is reduced to the ground potential (0 V).

In a region where the control voltage Vcont is lower than the second threshold voltage Vth2, the auxiliary charging circuit 36 becomes active, which raises the control voltage Vcont at a high speed. When the control voltage Vcont exceeds the second threshold voltage Vth2, the speed of change in the control voltage Vcont is controlled according to the source current (sink current) of the buffer 34.

As the control voltage Vcont rises, the charging current Ichg rises in proportion to the control voltage Vcont. That is to say, the slope of the cyclic signal OSC increases, and the peak voltage Vpeak also rises.

The peak voltage Vpeak rises in increments of timings (judgment timings) t1, t2, and t3 at which positive edges are detected in the synchronization signal SYNC. When the peak voltage Vpeak exceeds the first threshold voltage Vth1 at the time point t4 judgment timing, the judgment signal S3 (S2) is switched to the high level, which switches the reference voltage Vref1 to the first voltage value Vcont1. In response to the switching operation, the control voltage Vcont is reduced, which functions as feedback which reduces the charging current Ichg. As the charging current Ichg is reduced, the slope of the cyclic signal OSC is reduced, which reduces the peak voltage Vpeak at the next judgment timing t5.

As described above, with the oscillator circuit 100 shown in FIG. 1, the value of the charging current Ichg can be adjusted such that the peak voltage Vpeak approaches the first threshold voltage Vth1.

Next, description will be made regarding the operation in the self-running mode. In the self-running mode, the charging current Ichg that flows through the charging circuit 30 is maintained at a fixed value. This function is implemented by fixing the reference voltage Vref. As shown in FIG. 2B, the judgment signal S2 is switched to the high level every time the oscillator signal OSC reaches the first threshold voltage Vth1. After the judgment signal S2 is switched to the high level, the discharging instruction signal S4 is set to the high level during the second period τ2, which discharges the first capacitor C1.

The oscillator circuit 100 shown in FIG. 1 can be switched between the external synchronization mode and the self-running mode. Such an arrangement is capable of maintaining the peak voltage Vpeak of the cyclic signal OSC around the first threshold voltage Vth1 without involving complicated adjustments.

Figure 3:
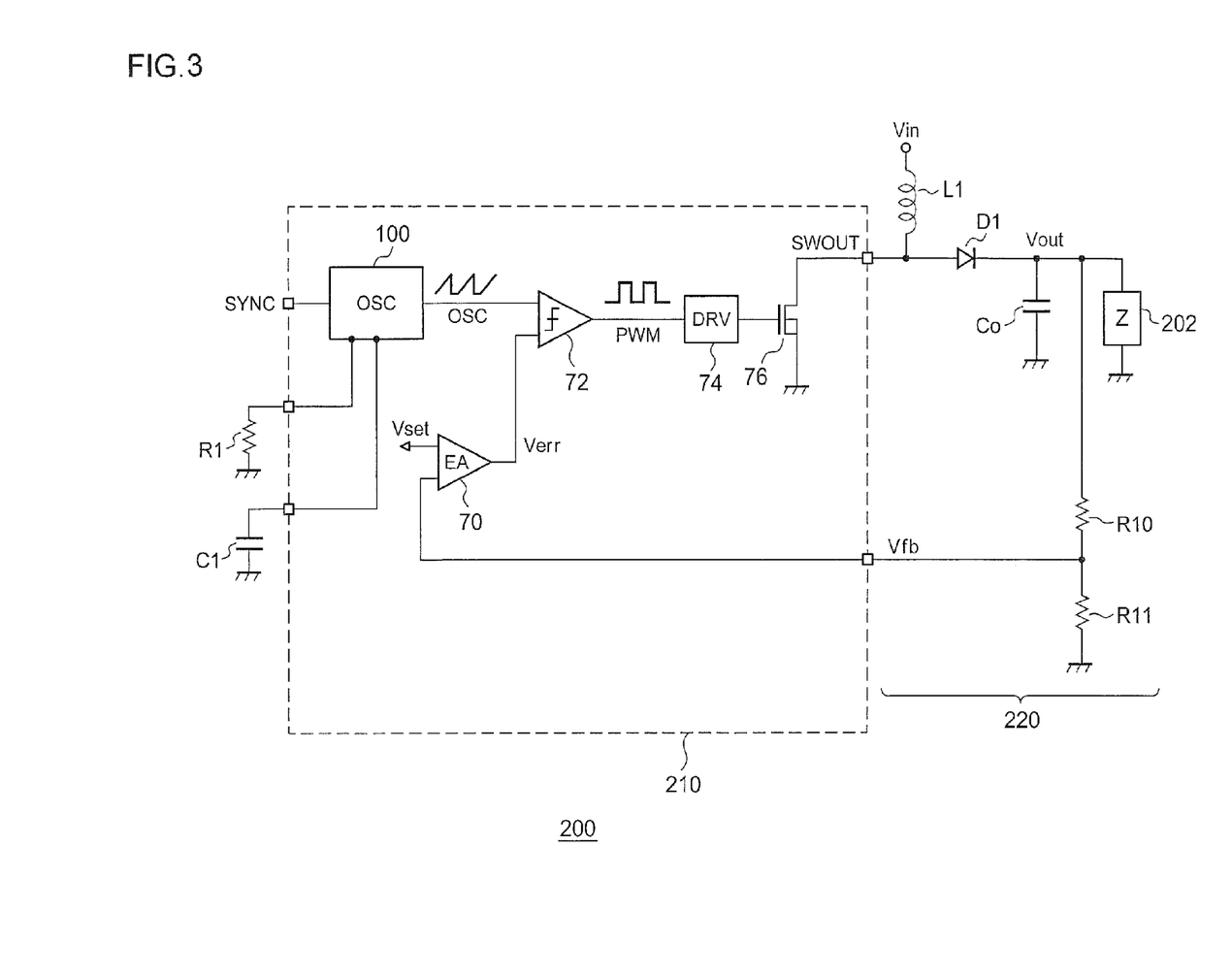
FIG. 3 is a circuit diagram which shows a configuration of a switching regulator including the oscillator circuit shown in FIG. 1.

Next, description will be made regarding an application of the oscillator circuit 100. FIG. 3 is a circuit diagram which shows a configuration of a switching regulator 200 including the oscillator circuit 100 shown in FIG. 1.

The switching regulator 200 is a step-up switching regulator, and includes a control circuit 210 and an output circuit 220. The output circuit 220 includes an inductor L1, a diode D1, an output capacitor Co, and feedback resistors R10 and R11. The output circuit 220 has a typical topology, and accordingly description thereof will be omitted.

The output voltage Vout of the switching regulator 200 is supplied to a load 202, and is divided by the resistors R10 and R11. The voltage thus divided is fed back to the control circuit 210 as a feedback voltage Vfb.

The control circuit 210 includes an error amplifier 70, a PWM comparator 72, a driver 74, a switching element 76, and the oscillator 100 shown in FIG. 1.

The oscillator circuit 100 receives a synchronization signal SYNC, and generates a cyclic signal OSC having a sloping waveform. The error amplifier 70 amplifies the difference between the feedback voltage Vfb and a predetermined setting voltage Vset, and generates an error voltage Verr. The PWM comparator 72 compares the cyclic signal OSC with the error voltage Verr received from the error amplifier 70, and generates a pulse width modulation signal (PWM signal). The driver 74 controls the ON/OFF operation of the switching element 76 according to the PWM signal.

For example, in a case in which the switching regulator 200 is mounted on a digital still camera, such an arrangement is capable of controlling the switching operation of the switching regulator 200 synchronously with a clock generated by an internal component of the camera. This reduces noise in an image acquired by the camera.

FIG. 3 shows an application in which the oscillator circuit 100 is used to generate a PWM signal. However, the usage of the oscillator circuit 100 is not restricted to such an application. For example, in some cases, in order to set the maximum duty ratio or the minimum duty ratio of the PWM signal, a switching regulator generates a pulse signal having a fixed duty ratio. The oscillator circuit 100 shown in FIG. 1 can be used to generate such a pulse signal.

Also, the switching regulator may be configured as a step-down switching regulator, an inverter switching regulator, or a step-up/step-down switching regulator. The topologies of the output circuit 220 and the switching element 76 should be modified according to the type thus employed.

Second Embodiment

Figure 4:
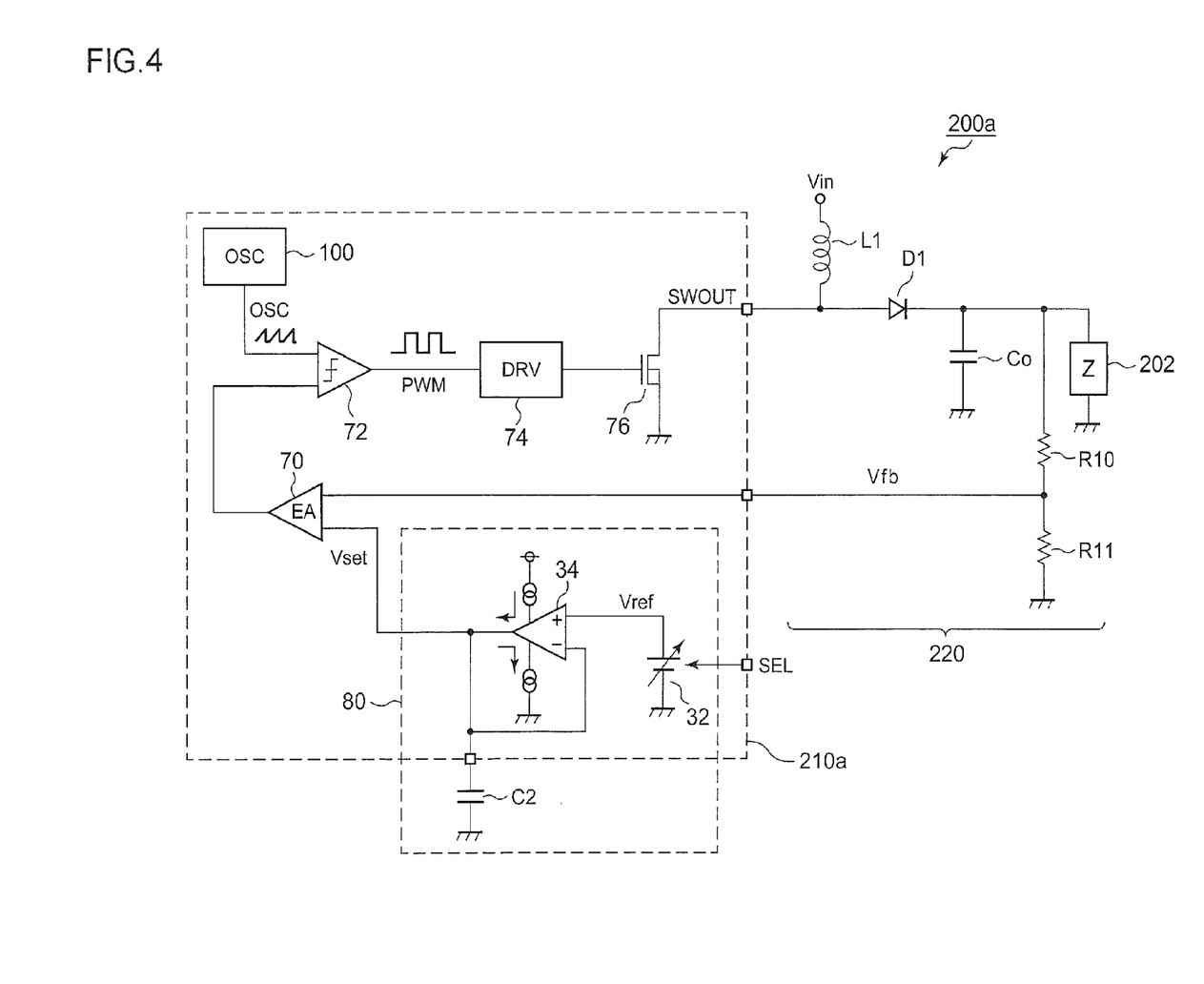
FIG. 4 is a circuit diagram which shows a configuration of a switching regulator according to a second embodiment.

Description will be made in the second embodiment regarding a soft-start technique which enables the switching regulator 200 to gradually change the output voltage Vout. FIG. 4 is a circuit diagram which shows a configuration of a switching regulator 200a according to the second embodiment.

The switching regulator 200a includes a control circuit 210a and an output circuit 220. The control circuit 210a includes an error amplifier 70, a PWM comparator 72, a driver 74, a switching element 76, an oscillator circuit 100, and a setting voltage generating unit 80.

Description has been made above regarding the error amplifier 70, the PWM comparator 72, the driver 74, and the switching element 76. The oscillator circuit 100 may have the same configuration as shown in FIG. 1. Also, the oscillator circuit 100 may have a different configuration.

The setting voltage generating unit 80 generates a setting voltage (soft-start voltage) Vs which is used as a reference voltage to be monitored by the error amplifier 70. The setting voltage generating unit 80 includes a reference voltage source 32, a second capacitor C2, and a buffer 34. The reference voltage source 32 generates a reference voltage Vref which can be switched between at least two values. The reference voltage source 32 receives a select signal SEL as an input signal. For example, when the select signal SEL is at the first level (high level), the reference voltage Vref is set to 1 V, and when the select signal SEL is at the second level (low level), the reference voltage Vref is set to 0.8 V.

The second capacitor C2 is arranged such that the electric potential of the first terminal is fixed. The buffer 34 is configured such that the source current and the sink current thereof are each maintained at predetermined values. The buffer 34 receives the reference voltage Vref, and applies the reference voltage Vref thus received to the second terminal of the second capacitor C2. That is to say, the setting voltage generating unit 80 has a configuration obtained by eliminating the auxiliary charging circuit 36 from the control voltage generating unit 30a shown in FIG. 1.

Figure 5:
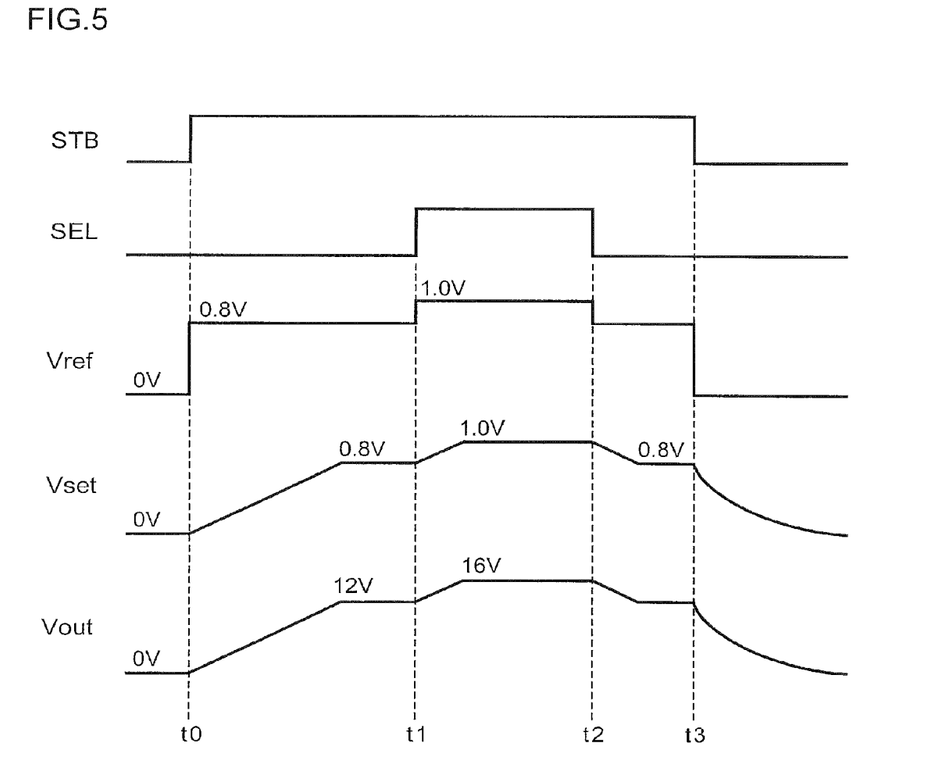
FIG. 5 is a time chart which shows the operation of the switching regulator shown in FIG. 4.

Next, description will be made regarding the operation of the switching regulator 200a shown in FIG. 4. FIG. 5 is a time chart which shows the operation of the switching regulator 200a shown in FIG. 4. Before the time point t0, a standby signal STB (not shown in FIG. 4) is negated, and accordingly, the operation of each block of the control circuit 210a is suspended. In the suspended state, the reference voltage Vref and the setting voltage Vset are each set to 0 V. Furthermore, the select signal SEL is set to the low level. At the time point t0, the standby signal STB is asserted, which starts the step-up operation of the switching regulator 200a.

When the standby signal STB is asserted at the time point t0, the reference voltage source 32 starts to generate the reference voltage Vref (=0.8 V). The setting voltage Vset rises until it reaches the reference voltage Vref (=0.8 V). As the setting voltage Vset gradually rises, the output voltage Vout of the switching regulator 200a gradually rises, thereby providing a soft-start operation.

At the time point t1, the select signal SEL is switched to the high level, which instructs the reference voltage source 32 to switch the reference voltage Vref to 1.0 V. As a result, the setting voltage Vset rises with time until it matches the reference voltage Vref (=1.0 V). The output voltage Vout of the switching regulator 200a rises as the setting voltage Vset rises. That is to say, such an arrangement is capable of gradually changing the output voltage Vout.

When the select signal SEL is set to the low level at the time point t2, the reference voltage source 32 switches the reference voltage Vref to 0.8 V. As a result, the setting voltage Vset falls with time until it reaches the reference voltage Vref (=0.8 V). The output voltage Vout gradually falls as the setting voltage Vset falls.

When the standby signal STB is negated at the time point t3, the control circuit 210a enters the suspended state. In this state, the output capacitor Co is discharged, thereby gradually reducing the output voltage Vout. Furthermore, the second capacitor C2 is discharged, thereby gradually reducing the setting voltage Vset.

With conventional switching regulators employing a soft-start circuit, the output voltage Vout can be gradually changed from 0 V to the first voltage (12 V). However, with such an arrangement, the switching transition from the first voltage value (12 V) to the second voltage value (16 V), and the reverse, become sharp. There is another approach for providing a smooth switching operation between the first and second voltages. That is to say, another capacitor is provided so as to perform a smooth switching operation between these voltages, in addition to the capacitor used to provide the soft-start operation. However, such an approach has a problem in that the number of circuit components (capacitors) is increased. In contrast, with the switching regulator 200a shown in FIG. 4, the output voltage Vout can be gradually switched between multiple voltage values using only the single capacitor C2.

Third Embodiment

Figure 6:
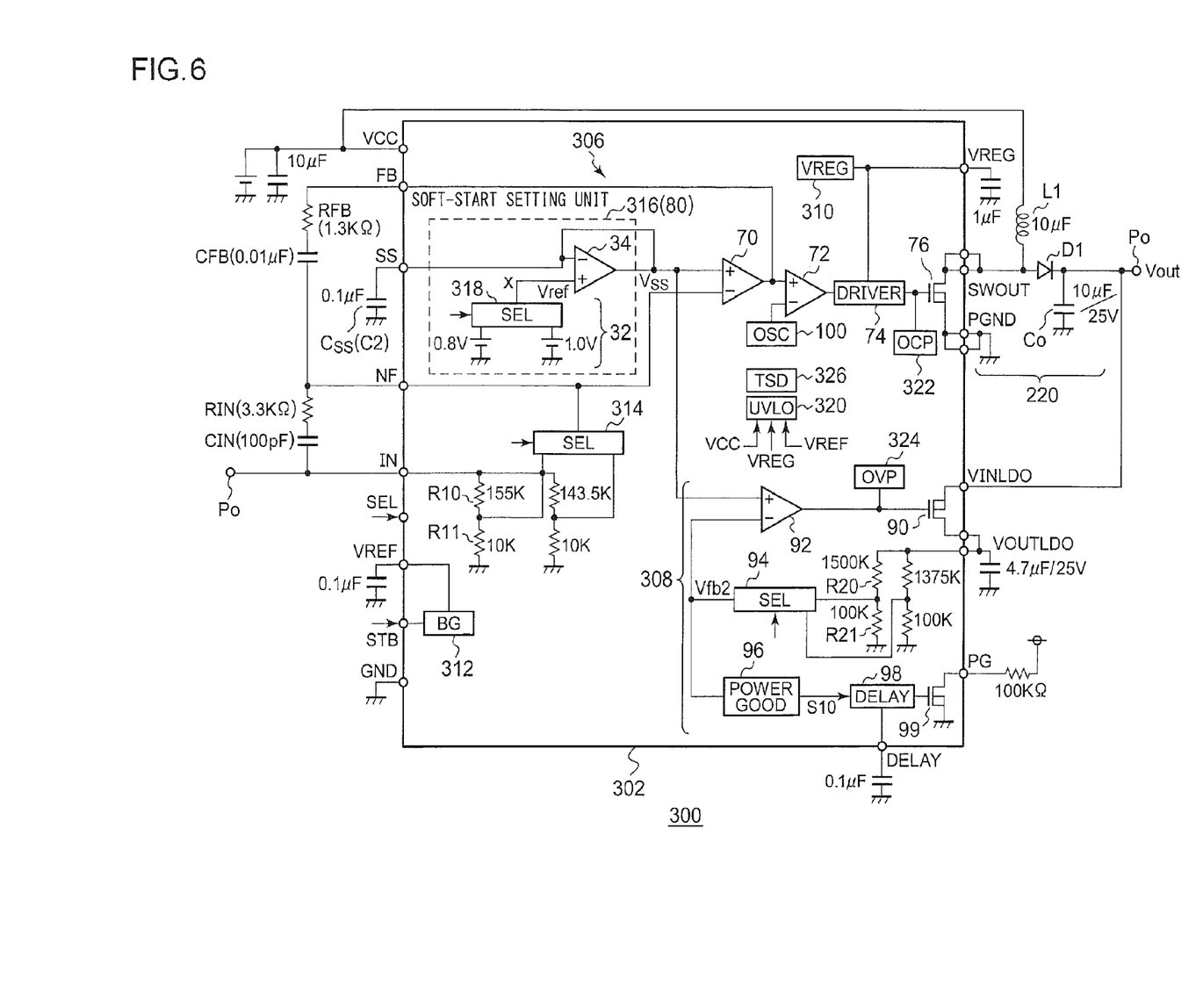
FIG. 6 is a circuit diagram which shows a configuration of a system power supply according to a third embodiment.

FIG. 6 is a circuit diagram which shows a configuration of a system power supply according to a third embodiment. The system power supply 300 includes: a single-channel switching regulator (DC/DC converter) configured to generate an output voltage Vout; and a single-channel linear regulator (low dropout voltage regulator) configured to generate an output voltage VOUTLDO.

The system power supply 300 is configured so as to enable the voltage level to be switched between the levels of these two output voltages Vout and VOUTTLDO according to the value of the select signal SEL.

The two output voltages and the soft-start voltage SS are set to the following values according to the voltage at the SEL terminal, i.e., the high level H (2.0 V<SEL<20.0 V) and the low level L (−0.3 V<SEL<0.3 V). The soft-start voltage SS is a voltage used as a reference by the switching regulator and the LDO.

(1) SEL=L
Vout=12.3 V
VOUTLDO=11.8 V
Vss=0.8 V
(2) SEL=H
Vout=16.5 V
VOUTLDO=16.0 V
Vss=1.0 V The system power supply 300 includes a control IC 302, a switching regulator output circuit (which will be simply referred to as "output circuit" hereafter) 220, and several external chip components.

The control IC 302 includes a single-channel step-up DC/DC controller 306 including N-channel MOSFETs as built-in components, a single-channel low dropout regulator (LDO) 308, a regulator 310, and a band gap reference circuit 312.

The regulator 310 generates a 5.0 V voltage VREF to be supplied to the driver 74. The band gap reference circuit 312 generates a 3.0 V reference voltage VREF.

Description will be made regarding the circuit configuration of the DC/DC converter. The output circuit 220 has the same configuration as those shown in FIG. 3 and FIG. 4. The output voltage Vout of the DC/DC converter is fed back to the feedback input terminal IN. In FIG. 6, the feedback resistors R10 and R11 are provided as built-in components included in the control IC 302. The resistor pair can be switched, by means of a selector 314, between two resistor pairs having different voltage dividing ratios. That is to say, the voltage dividing ratio is switched according to the select signal SEL input to the select terminal SEL. A feedback voltage Vfb that corresponds to the output voltage Vout is input to the error amplifier 70 via the selector 314.

The soft-start setting unit 316 corresponds to the setting voltage generating unit 80 shown in FIG. 4. The soft-start setting unit 316 generates a soft-start voltage Vss (which corresponds to the setting voltage Vset shown in FIG. 4), and outputs the soft start voltage Vss thus generated to the error amplifier 70. The reference voltage source 32 of the soft-start setting unit 316 includes a selector 318, which allows the voltage to be selected from either 1.0 V and 0.8 V according to the level of the select signal SEL. The reference voltage Vref thus selected by the selector 318 is input to the buffer 34. The capacitor Css corresponds to the second capacitor C2 shown in FIG. 4.

The output voltage SS of the soft-start setting unit 316 gradually rises with time. The period of time (soft-start time) Tss [sec] required for the output voltages Vout and VOUTLDO to reach the 100% output value from the start-up operation is represented by the following Expression.

$$Tss = Css \times Vss/Iss \text{ [sec]}$$

Here, Vss represents the output voltage (Vref) of the reference voltage source 32. When SEL=L, Vss is set to 0.8 V, and when SEL=H, Vss is set to 1.0 V. Iss represents the charging current applied to the SS terminal. In a typical example, Iss is set to 5 μA. For example, in a case in which Tss is to be set to 20 msec, when SEL=H, the capacitance value becomes: Css=Iss×Tss/Vss=5 μA×20 msec/1 V=0.1 μF. In a case in which a capacitor having this capacitance value is connected to the SS terminal, when the circuit is started up with SEL=L, Vss is set to 0.8 V, and accordingly, the soft-start time Tss becomes: Tss=0.1 μF×0.8 V/5 μA=16 msec.

By switching the SEL terminal voltage between the L voltage and the H voltage in the operation, the system power supply 300 is capable of switching the output voltages Vout and VOUTLDO. Such an arrangement provides a soft switching function for suppressing an overshoot and an undershoot of the output voltage in the switching operation. The output voltage transition time Tx [sec] required in the soft switching operation is represented by the following Expression using the capacitance value of the capacitor connected to the SS terminal, in the same way as in the setting operation for the soft start time Tss.

$$Tx = Css \times \Delta Vss/Iss \text{ [sec]}$$

Figure 7:
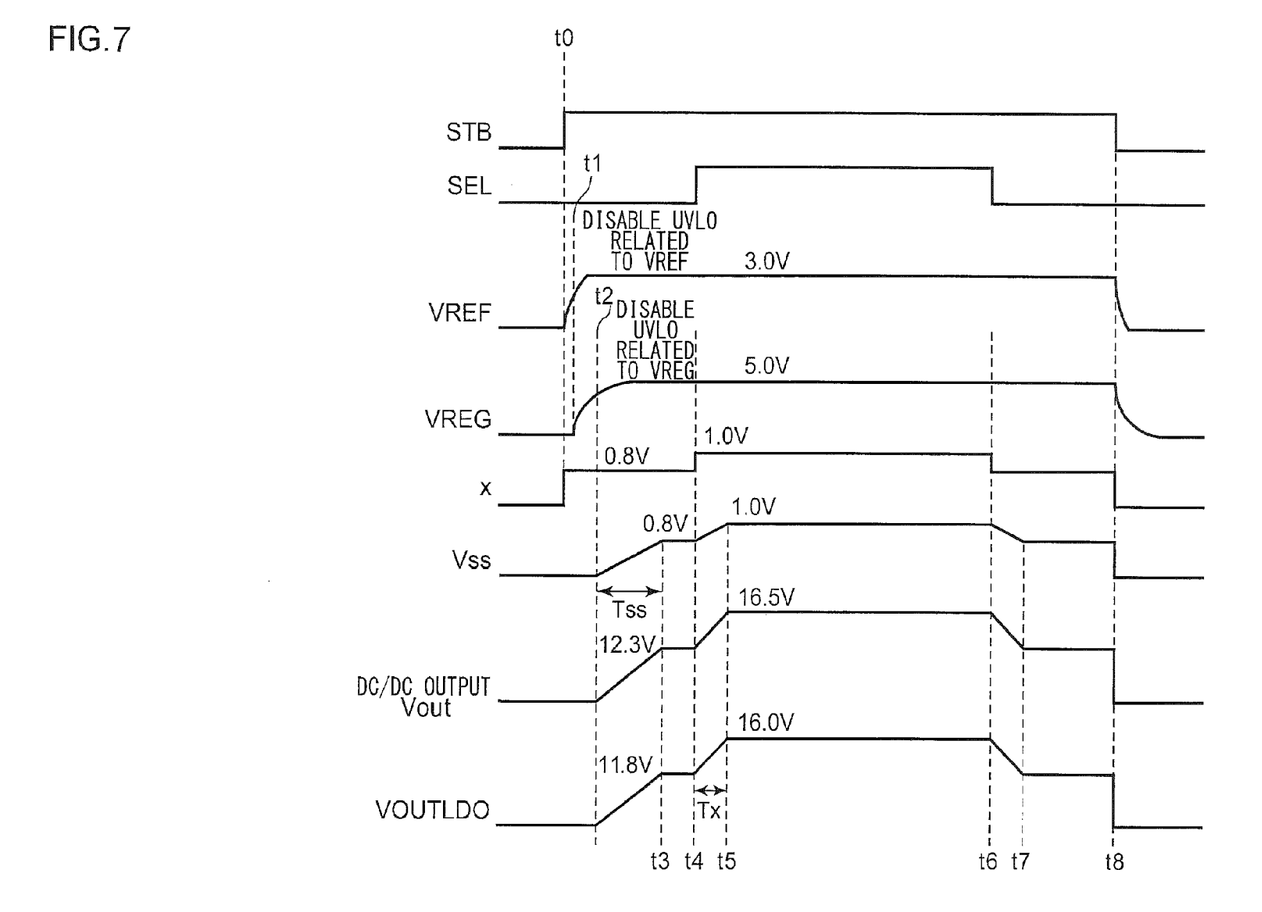
FIG. 7 is a time chart which shows a soft-switching operation of the system power supply shown in FIG. 6.

Here, ΔVss represents the variation in the soft start voltage Vss, which is 1.0−0.8=0.2. FIG. 7 is a time chart which shows the soft switching operation of the system power supply 300 shown in FIG. 7. When the standby (STB) terminal voltage is set to the high level at the time point t0, the regulator 310 and the band gap reference circuit 312 are started up. Subsequently, when the reference voltage VREF exceeds a predetermined threshold value at the time point t1, the UVLO (low voltage lockout) related to the VREF is disabled. Continuing from this, when the reference voltage VREG exceeds a predetermined threshold value at the time point t2, the UVLO related to the VREG is disabled. Subsequently, the soft-start setting unit 316 is started up, and the soft-start voltage Vss rises toward 0.8 V. The two output voltages Vout and VOUT-LDO each rise as the soft-start voltage Vss rises, and each reach their target values at the time point t3 after the soft-start time Tss elapses.

At the time point t4, the terminal voltage SEL is switched to the high level, which is an instruction to switch the level of the output voltage. Upon receiving this instruction, the electric potential at the node x is switched from 0.8 V to 1 V, and the soft-start voltage Vss starts to rise with time. At the time point t5 after the transition time Tx elapses, the two output voltages Vout each reach their target values.

When the select terminal SEL is switched to the low level at the time point t6, the output voltages Vout and VOUTLDO each transit to their lower target values at the time point t7 after the transition time Tx elapses. When the standby terminal voltage is switched to the low level at the time point t8, the regulator 310 and the band gap reference circuit 312 are turned off, which shuts down the circuit.

Next, description will be made regarding the LDO 308. The LDO 308 steps down and stabilizes the output voltage Vout of the DC/DC converter, and outputs the output voltage VOUTLDO thus stepped down and stabilized. The LDO 308 includes a transistor 90, an error amplifier 92, feedback resistors R20 and R21, a selector 94, a power-good circuit 96, a delay circuit 98, and a transistor 99.

The feedback resistors R20 and R21 divide the output voltage VOUTLDO. The control IC 302 includes two pairs of resistors R20 and R21 having different voltage dividing ratios. Such an arrangement allows the voltage dividing ratio to be switched by means of the selector 94. The output voltage Vfb2 divided by the voltage dividing ratio thus set according to the select signal SEL is fed back to the error amplifier 92. The error amplifier 92 amplifies the difference between the feedback voltage Vfb2 and the soft-start voltage Vss so as to adjust the gate voltage of the transistor 90, thereby adjusting the voltage drop that occurs at the transistor 90. As a result, the output voltage VOUTLDO is maintained at a target value that corresponds to the soft-start voltage Vss.

The power-good circuit 96 monitors the output voltage VOUTLDO of the LDO 308, and generates a power-good signal S10 which indicates whether or not the voltage level is satisfactory, and switches the electric potential at a power-good terminal PG. The internal component connected to the PG terminal is configured as an open-drain format N-channel MOSFET 99, which is used with the PG terminal pulled up to the level of the external power supply. When the output voltage VOUTLDO of the LDO 308 is at or below 80% of the set voltage, power-good fault detection occurs, the power-good signal S10 is negated, and the PG terminal is thus switched to the low level. When the output voltage is at or above 90% of the set voltage, the power-good signal S10 is asserted (power-good protection is released), which switches the PG terminal to the high level. In a case in which the user desires to operate the LDO 308 without involving the power-good function, the DELAY terminal and the PG terminal should be left open.

The delay circuit 98 delays the power-good signal S10 output from the power-good circuit 96 by a detection delay time TDELAY. When the voltage level remains abnormal for the delay time TDELAY or more, such an arrangement switches the electric potential at the PG terminal. The detection delay time TDELAY from the time point at which power-good fault detection occurs up to the switching of the PG terminal is represented by the following Expression using the capacitance value of a capacitor CDELAY [μF]:

$$TDELAY = CDELAY \times VthDELAY / IDELAY$$

VthDELAY: DELAY terminal threshold voltage (typically 0.8 V)

IDELAY: DELAY terminal flow current (typically 1 μA)

When the IC is started up, the power-good function and the soft-start function operate at the same time. Accordingly, if the period of time required for the output voltage to reach 90% of the set voltage using the soft-start function is set to a period of time which is greater than the power-good detection delay time, power-good fault detection occurs in the IC start-up operation. Accordingly, the delay time TDELAY must be set longer than the period of time required for the output voltage to reach 90% of the set voltage.

Figure 8:
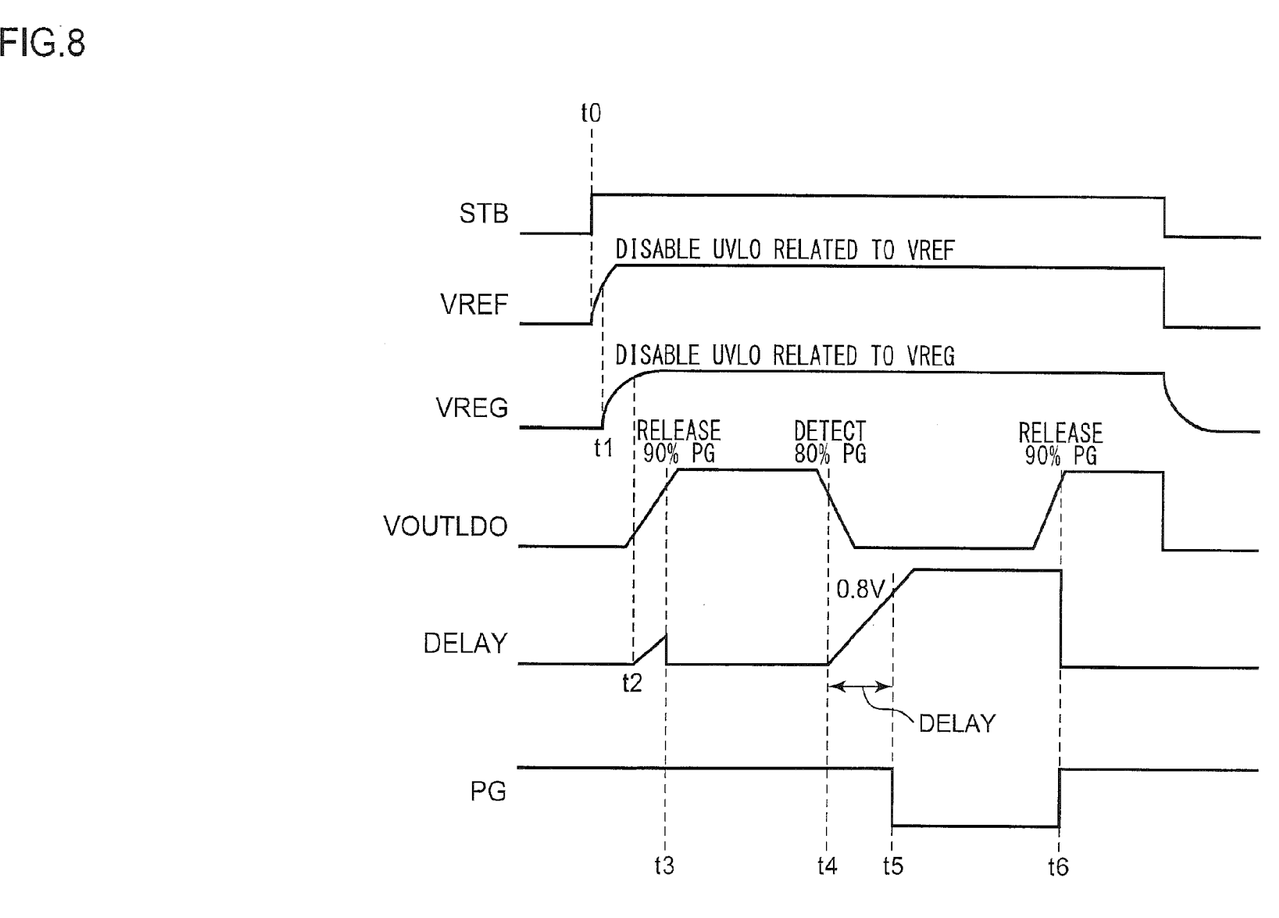
FIG. 8 is a time chart which shows a power-good detection operation of the system power supply shown in FIG. 6.

FIG. 8 is a time chart which shows the power-good fault detection operation. From the time point t0 up to the time point t2, the time chart shows the same operation as shown in FIG. 7. Before the time point t3, the output voltage VOUTLDO is at or below 90% of the set value. However, in this case, the detection delay time TDELAY has not elapsed. Accordingly, the PG signal remains asserted (high level). When the output voltage VOUTLDO reaches 90% of the target value at the time point t3, the power-good fault detection function is disabled.

Subsequently, when the output voltage VOUTLDO becomes lower than 80% of the set value at the time point t4, and remains in this state for the detection delay time TDELAY, the PG signal is asserted at the time point t5. When the output voltage VOUTLDO reaches 90% of the target value again, power-good fault detection is released, and the PG signal is asserted (switched to the high level).

The UVLO (UnderVoltage LockOut circuit) 320 is a protection circuit which prevents IC malfunctions when the power is turned on or turned off. If the VCC terminal voltage is at or below 4.0 V, the UVLO 320 turns off the DC/DC converter and the LDO, and fixes the SS terminal at the low level. The detection of the UVLD has a hysteresis of 0.1 V. This prevents IC malfunctions due to fluctuation of the input voltage around the threshold level. Furthermore, such an arrangement provides a protection function for preventing IC malfunctions when the voltage VREG at the internal regulator 310 becomes low. Specifically, if the voltage at the VREG becomes 2.7 V or less, the UVLO 320 turns off the DC/DC converter and the LDO, and fixes the SS terminal at the low level. A hysteresis width of 0.6 V is set for the detection of the VREG. Moreover, the UVLO 320 monitors the reference voltage VREF. If the reference voltage VREF becomes 1.1 V or less, the UVLO 320 turns off the internal regulator 310. No hysteresis is set for detection of VREF.

The OCP (OverCurrent Protection circuit) 322 monitors the current that flows through the switching element 76. When the current enters an overload state (550 mA or more), the OCP provides foldback-type overcurrent protection. The setting values of the OCP are provided as fixed values set in the control IC 302.

The OVP (OverVoltage Protection circuit) 324 is provided in order to prevent IC malfunctions due to overvoltage input to the LDO 308. If the VINLDO terminal voltage becomes 20 V or more, the OVP 324 turns off the LDO 308.

The TSD (Thermal ShutDown circuit) 326 is a protection circuit provided in order to prevent adverse effects on the reliability of the IC due to abnormal generation of heat. If the TSD 326 detects abnormal generation of heat on the chip (abnormal temperature of 175° C., for example), the TSD 326 turns off the DC/DC converter and the LDO 308.

Next, description will be made regarding the frequency response characteristics of the DC/DC converter.

The standard stability condition to be set for a feedback system to which negative feedback is applied is to maintain a phase lag of 135° or less when the gain is set to 1 (0 dB). Furthermore, the DC/DC converter performs a sampling operation at a switching frequency. Accordingly, the frequency bandwidth GBW (which defines the frequency at which the gain becomes zero) for the overall system must be set to approximately ¹⁄₁₀ the switching frequency. In order to satisfy the aforementioned two requirements, there is a need to set the first resistor R11, the second resistor R10, a feedback resistor RFB, an input resistor RIN, a feedback capacitor CFB, and an input capacitor CIN, as follows.

(1) CFB

The control IC 302 includes the R11 set to 155 kΩ (when SEL=H) or 143.5 kΩ (when SEL=L) as a built-in component. Such an arrangement is capable of setting the first-order pole, which determines the frequency bandwidth of the DC/DC converter, using the value of the CFB.

$$fp=1/(2\pi \cdot (A \times (R11 \cdot R10)/(R11+R10) \times CFB)$$

The DC gain of the DC/DC converter is:

$$DC\_Gain = A/B \times Vout/(Vout-Vin).$$

Here, A represents the gain of the error amplifier 70, B represents the amplitude of the oscillator circuit 100, Vin represents the input voltage of the DC/DC converter, and Vout represents the output voltage.

Based upon this Expression, the frequency fsw at which the gain becomes 0 dB when the DC gain is band-limited to the level of the first-order pole or less is represented by the following Expression.

$$fsw = fp \times DC\_Gain = 1/\{2\pi(C2 \times (R11 \cdot R10)/(R11+R10))\} \times 1/B \times Vout/(Vout-Vin).$$

The recommended switching frequency value is approximately 10 kHz. In a case in which the load response is prioritized, the switching frequency can be raised, up to approximately 20 kHz.

(2) Settings of RFB, RIN, and CIN

The second-order pole is generated by the coil and capacitor of the step-up DC/DC converter, and is represented by the following Expression.

$$fLC = (1-D)/(2\pi \sqrt{(LC)})$$

Here, D represents the ON duty ratio, where D=(Vout−Vin)/Vout.

180° phase inversion occurs at the second-order pole. In order to ensure that the system is stable, there is a need to insert two zero points in order to compensate for this.

Zero point by means of RFB and CFB: fz=1/(2π·RFB·CFB)

Zero point by means of CIN: fz2=1/(2π·R10·CIN)

By setting the zero points fz1 and fz2 at frequencies from ½ to twice the second-order pole frequency fLC, the optimum phase margin can be obtained.

While the preferred embodiments of the present invention have been described using specific terms, such description is for illustrative purposes only, and it is to be understood that changes and variations may be made without departing from the spirit or scope of the appended claims.

What is claimed is:

1. An oscillator circuit comprising:
a first capacitor arranged such that the electric potential at a first terminal thereof is fixed;
a first discharging circuit configured to discharge the first capacitor at a timing that corresponds to a cyclic synchronization signal received from an external circuit;
a comparator configured to compare the voltage at another, second terminal of the first capacitor having the aforementioned first terminal with a predetermined threshold voltage, and to generate a judgment signal that corresponds to the comparison result; and
a charging circuit configured to generate a charging current the current value of which is adjusted according to the level of the judgment signal at a timing that corresponds to the synchronization signal, and to supply the charging current thus generated to the first capacitor,
wherein the voltage at the second terminal of the first capacitor is output as a cyclic signal.

2. An oscillator circuit according to claim 1, wherein the charging circuit comprises:
a control voltage generating unit configured to generate a control voltage according to the judgment signal; and
a voltage/current conversion circuit configured to convert the control voltage into a current, thereby generating the charging current that corresponds to the control voltage,
and wherein, when the judgment signal is at a first level, the control voltage generating unit adjusts the control voltage such that it approaches a predetermined first voltage value, and when the judgment signal is at a second level, the control voltage generating unit adjusts the control voltage such that it approaches a predetermined second voltage value.

3. An oscillator circuit according to claim 1, wherein the charging circuit further comprises a flip-flop configured to latch the judgment signal at a timing that corresponds to the synchronization signal.

4. An oscillator circuit according to claim 2, wherein the control voltage generating unit comprises:
a reference voltage source configured to generate a reference voltage adjusted such that, when the judgment signal is at the first level, the reference voltage is set to the first voltage value, and when the judgment signal is at the second level, the reference voltage is set to the second voltage value;
a second capacitor arranged such that the electric potential at a first terminal thereof is fixed; and
a buffer configured such that the source current and the sink current thereof are each maintained at predetermined values or less, and configured to receive the reference voltage, and to supply the reference voltage thus received to another, second terminal of the aforementioned second capacitor having the aforementioned first terminal,
and wherein the electric potential at the second terminal of the second capacitor is output as the control voltage.

5. An oscillator circuit according to claim 4, wherein the control voltage generating unit further comprises an auxiliary charging circuit configured such that, when the electric potential at the second terminal of the second capacitor is lower than a predetermined threshold voltage, the auxiliary charging circuit supplies an auxiliary current to the second capacitor.

6. An oscillator circuit according to claim 1, further comprising a second discharging circuit configured such that, upon detecting, based upon the judgment signal, that the voltage at the second terminal of the first capacitor has reached the threshold voltage, the second discharging circuit discharges the first capacitor.

7. A switching regulator including a switching element, comprising:
   an error amplifier configured to amplify the difference between a feedback voltage that corresponds to an output voltage of the switching regulator and a predetermined set voltage;
   an oscillator circuit according to claim 1, configured to generate a cyclic signal according to a cyclic synchronization signal;
   a pulse width modulation comparator configured to compare the cyclic signal with the output voltage of the error amplifier so as to generate a pulse width modulation signal; and
   a driver configured to control an ON/OFF operation of the switching element according to the pulse width modulation signal.

8. A switching regulator including a switching element, comprising:
   a set voltage generating unit configured to generate a set voltage;
   an error amplifier configured to amplify the difference between a feedback voltage that corresponds to an output voltage of the switching regulator and a predetermined set voltage;
   an oscillator circuit configured to generate a cyclic signal;
   a pulse width modulation comparator configured to compare the cyclic signal with the output voltage of the error amplifier so as to generate a pulse width modulation signal; and
   a driver configured to control an ON/OFF operation of the switching element according to the pulse width modulation signal,
   wherein the set voltage generating unit comprises
      a reference voltage source configured to generate a reference voltage which can be switched between at least two values,
      a first capacitor arranged such that the electric potential at a first terminal thereof is fixed, and
      a buffer configured such that the source current and the sink current thereof are each maintained at predetermined values or less, and configured to receive the reference voltage, and to supply the reference voltage thus received to another, second terminal of the aforementioned first capacitor having the aforementioned first terminal,
   and wherein the electric potential at the second terminal of the first capacitor is output as the set voltage.

9. A switching regulator according to claim 8, further comprising a linear regulator configured to receive the output voltage of the switching regulator, to stabilize the output voltage thus received, and to output the output voltage thus stabilized, wherein the oscillator circuit comprises:
   a second capacitor arranged such that the electric potential at a first terminal thereof is fixed;
   a first discharging circuit configured to discharge the second capacitor at a timing that corresponds to a cyclic synchronization signal received from an external circuit;
   a comparator configured to compare the voltage at another, second terminal of the second capacitor having the first terminal with a predetermined threshold voltage, and to generate a judgment signal that corresponds to the comparison result; and
   a charging circuit configured to generate a charging current the current value of which is adjusted according to the level of the judgment signal at a timing that corresponds to the synchronization signal, and to supply the charging current thus generated to the second capacitor,
   and wherein the voltage at the second terminal of the second capacitor is output as a cyclic signal.

10. A switching regulator according to claim 9, further comprising a select terminal configured to allow a select signal to be input, which is used to set the output voltage of the switching regulator and the output voltage of the linear regulator,
   wherein, when the select signal is at a first level, the reference voltage source of the set voltage generating unit generates a reference voltage having a first value, and when the select signal is at a second level, the reference voltage source generates a reference voltage having a second value which is greater than the first value,
   and wherein, when the select signal is at the first level, the switching regulator outputs an output voltage having a third value, and when the select signal is at the second level, the switching regulator outputs an output voltage having a fourth value which is greater than the third value,
   and wherein, when the select signal is at the first level, the linear regulator outputs an output voltage having a fifth value, and when the select signal is at the second level, the linear regulator outputs an output voltage having a sixth value which is greater than the fifth value.

11. A switching regulator according to claim 9, further comprising a power-good circuit configured to monitor the output voltage of the linear regulator, and to generate a power-good signal which indicates whether or not the voltage level is satisfactory, which is used to switch the electric potential at a power-good terminal.

12. A switching regulator according to claim 11, further comprising a delay circuit configured to set a detection delay time which defines a delay period required for the transition of the electric potential at the power-good terminal after the level of the power-good signal is switched.

13. A switching regulator according to claim 9, wherein a soft-start time Tss required for the transition of the output voltages of the switching regulator and the linear regulator is determined by the capacitance Css of the second capacitor, the current value Iss of the source current and the sink current, and the reference voltage Vss.

14. A switching regulator according to claim 9, further comprising:
   a first resistor R10 and a second resistor R11 configured to divide the output voltage Vout of the switching regulator;
   an input resistor RIN and an input capacitor CIN arranged in series between an output terminal of the switching regulator and one input terminal of the error amplifier; and
   a feedback capacitor CFB and a feedback resistor RFB arranged in series between the aforementioned one input terminal of the error amplifier and the output terminal of the error amplifier, and wherein the frequency of a 0 dB point fsw when the DC gain of the switching regulator is limited by a first-order pole is represented by the Expression fsw=$1/\{2\pi(C2\times(R11\cdot R10)/(R11+R10))\}\times 1/B\times Vout/(Vout-Vin)$, using the input voltage Vin and the output voltage Vout of the switching regulator, and the amplitude B of the cyclic signal.

* * * * *